US006846396B2

(12) United States Patent
Perrin

(10) Patent No.: US 6,846,396 B2
(45) Date of Patent: Jan. 25, 2005

(54) ACTIVE MAGNETIC SHIELDING

(75) Inventor: Mark A. Perrin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 28 days.

(21) Appl. No.: 10/215,968

(22) Filed: Aug. 8, 2002

(65) Prior Publication Data
US 2004/0026233 A1 Feb. 12, 2004

(51) Int. Cl.$^7$ .......................... C23C 14/34; C23C 14/35; B05C 11/11; H01L 21/306
(52) U.S. Cl. ............................ 204/298.11; 204/298.16; 204/192.12; 118/504; 156/345.3
(58) Field of Search ....................... 204/298.11, 298.16, 204/192.12; 118/504; 156/345.3

(56) References Cited

U.S. PATENT DOCUMENTS

| | | | |
|---|---|---|---|
| 4,060,470 A | 11/1977 | Clarke | 204/192 R |
| 4,174,419 A | 11/1979 | Nienart | 428/313 |
| 4,189,618 A | 2/1980 | Bretts et al. | 174/35 MS |
| 4,223,245 A | 9/1980 | Ogura et al. | 315/39.51 |
| 4,239,611 A | 12/1980 | Morrison, Jr. | 204/298 |
| 4,370,217 A | 1/1983 | Funaki | 204/298 |
| 4,431,473 A | 2/1984 | Okano et al. | 156/345 |
| 4,547,279 A | 10/1985 | Kiyota et al. | 204/298 |
| 4,803,452 A | 2/1989 | Saji et al. | 335/301 |
| 4,828,931 A | 5/1989 | Ogawa et al. | 428/596 |
| 4,890,083 A | 12/1989 | Trenkler et al. | 335/301 |

(List continued on next page.)

FOREIGN PATENT DOCUMENTS

| | | | | |
|---|---|---|---|---|
| JP | 63 149373 | 6/1988 | ........... | C23C/14/34 |
| JP | 3064461 | 3/1991 | ........... | C23C/14/35 |
| JP | 3150359 | 6/1991 | ........... | C23C/14/55 |
| JP | 6192833 | 7/1994 | ........... | C23C/14/35 |
| JP | 8103426 | 4/1996 | ............ | A61B/5/55 |
| JP | 3243761 | 10/2001 | ........... | C23C/14/34 |

OTHER PUBLICATIONS

JP 62–37372 English abstract.*
U.S. Provisional application for Patent Ser. No. 06/400,097, filed on Aug. 1, 2002, entitled "Self–Ionized and Capacitively–Coupled Plasma for Sputtering and Resputtering," invented by P. Gopairaja, J. Fu, X. Tang, J.C. Foster and U. Kelkar.
U. S. patent application serial No. 09/2326,739, filed on Jan. 7, 1999, entitled "Transverse Magnetic Field for Ionized Sputter Deposition," invented by J. Fu.
U. S. patent application Serial No. 08/733,620, filed on Oct. 17, 1996, entitled "A Method to Eliminate Coil Sputtering in an ICP Source," invented by Z. Xu, F. Chen and J. Nulman.
U. S. patent application serial No. 09/993,543, filed on Nov. 14, 2001, entitled "Magnet Array in Conjunction with Rotating Magnetron for Plasma Sputtering."
U.S. patent application No. 10/407,893 filed Apr. 4, 2003; (29 pp as filed; 3 pp format drawings).

Primary Examiner—Steven Versteeg
(74) Attorney, Agent, or Firm—Konrad, Raynes & Victor

(57) ABSTRACT

Methods and apparatuses for shielding magnetic flux which is associated with a semiconductor fabrication system are provided. A magnetic shield assembly substantially surrounds a side wall of a plasma reactor. The shield assembly comprises a passive shield member in combination with an active shield member. As a result, effective shielding of magnetic flux can occur without excessive distortion of the magnetic field line pattern in the plasma region of the plasma reactor. In one aspect, the shield assembly comprises a first shield member adapted to attenuate a magnetic flux density. The first shield member is disposed in a parallel, spaced apart relationship from the side wall. A second member is attached to the first shield member and is constructed of a ferromagnetic material which is permanently magnetized.

64 Claims, 8 Drawing Sheets

U.S. PATENT DOCUMENTS

| | | | |
|---|---|---|---|
| 4,939,424 A | 7/1990 | Kieser et al. | 315/111.21 |
| 5,061,685 A * | 10/1991 | Kosuge et al. | 505/213 |
| 5,089,334 A | 2/1992 | Mallary et al. | 428/336 |
| 5,258,573 A | 11/1993 | Sugioka et al. | 174/35 R |
| 5,266,146 A | 11/1993 | Ohno et al. | 156/345 |
| 5,417,834 A | 5/1995 | Latz | 204/298.11 |
| 5,464,518 A | 11/1995 | Sieck et al. | 204/192.12 |
| 5,605,576 A | 2/1997 | Sasaki et al. | 118/723 E |
| 5,656,141 A | 8/1997 | Betz et al. | 204/298.05 |
| 5,790,006 A | 8/1998 | Abele et al. | 335/306 |
| 5,902,461 A | 5/1999 | Xu et al. | 204/192.12 |
| 6,027,826 A | 2/2000 | deRochemont et al. | 428/702 |
| 6,136,166 A | 10/2000 | Shen et al. | 24/293.16 |
| 6,225,887 B1 | 5/2001 | Jensen et al. | 335/306 |
| 6,254,746 B1 * | 7/2001 | Subramani et al. | 204/298.11 |
| 6,277,249 B1 | 8/2001 | Gopalraja et al. | 204/192.12 |
| 6,296,747 B1 | 10/2001 | Tanaka | 204/298.07 |
| 6,358,376 B1 | 3/2002 | Wang et al. | 204/142.12 |
| 6,368,469 B1 | 4/2002 | Nulman | 204/192.12 |

* cited by examiner

ACTIVE MAGNETIC SHIELDING

FIELD OF THE INVENTION

This invention relates to methods and apparatuses for sputtering a material onto a semiconductor workpiece using a plasma as part of a semiconductor fabrication system. In particular, the invention relates to magnetic shielding associated with such a fabrication system.

BACKGROUND

Low density plasmas have become convenient sources of energetic ions and activated atoms which can be employed in a variety of semiconductor workpiece fabrication processes including surface treatments, depositions, and etching processes. (Semiconductor workpieces can include semiconductor wafers as well as glass compositions having semiconductor materials deposited thereon.) For example, to deposit materials onto a semiconductor wafer using a sputter deposition process, a plasma is produced in the vicinity of a sputter target material which is negatively biased. Ions created adjacent to the target impact its surface to dislodge, i.e., "sputter," material from the target. The sputtered materials are then transported and deposited on the surface of the semiconductor wafer.

Sputtered material has a tendency to travel in straight line paths from the target to the substrate, at angles which are oblique to the surface of the substrate. As a consequence, materials deposited in etched trenches and holes of semiconductor devices having trenches or holes with a high depth to width aspect ratio, can bridge over causing undesirable cavities in the deposition layer.

To prevent such cavities, the sputtered material can be redirected into substantially vertical paths between the target and the substrate by negatively charging the substrate to position vertically oriented electric fields adjacent the substrate if the sputtered material is sufficiently ionized by the plasma. However in systems which employ balanced magnetrons, material sputtered in a low density plasma often has an ionization degree of less than about 5% which is usually insufficient to avoid the formation of an excessive number of cavities. (In systems which employ unbalanced magnetrons, the ionization degree can be about 20%.) Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

Frequently, magnets or a magnetron are positioned in back of the target to create a magnetic field adjacent to the target. The magnetic field traps electrons in the plasma region thus increasing the ion density. As a result, the plasma density and sputter rate are increased.

However advances in semiconductor processing designs have resulted in the need for increasingly dense plasmas. This in turn has resulted in the use of increasingly strong magnets and magnetrons positioned in the back of targets. Such magnets often produce stronger magnetic fields which can extend well beyond the plasma chamber. Sometimes, such fields can extend to and interfere with adjacent equipment such as other plasma chambers or other equipment.

The present invention is directed toward improvements in the designs of semiconductor fabrication devices for reducing the magnetic fields external to the source plasma chamber.

SUMMARY OF THE ILLUSTRATED EMBODIMENTS

A magnetic shield assembly which substantially surrounds a plasma region of a plasma reactor is provided. The shield assembly uses a passive shield member in combination with an active shield member. As a result, effective shielding of magnetic flux can occur without excessive distortion of the magnetic field line pattern in the plasma region.

In one aspect, a shield assembly is for a plasma reactor having a target and a semiconductor workpiece support facing the target along an axis. The shield assembly comprises a first shield member constructed of a material which is adapted to attenuate a magnetic flux density. The first shield member is disposed so that at least a portion is in a region located between first and second imaginary parallel planes located along the axis at axial locations between the target and the workpiece support. A second member is magnetically coupled with the first shield member. The second member is constructed of a ferromagnetic material which is permanently magnetized and is disposed so that at least a portion of the second member is in the region located between the first and the second planes.

In another aspect, the second member is attached to the first shield member and is a sheet of material having a generally planar or a generally arcuate shape.

In an alternative embodiment, a plurality of tiles are attached to the first shield member. The tiles are constructed of a ferromagnetic material which is permanently magnetized. Each of the tiles has four sides and a magnetic pole which is oriented generally diagonally to the sides.

In another aspect, each of the tiles has three sides and a magnetic pole which is oriented generally perpendicular to one of said three sides.

In yet another embodiment, a plasma reactor has a side wall which defines a cylinder having an axis. The second member has a first magnetic pole which is oriented other than parallel with and perpendicular to the axis.

In another aspect, a third member is attached to either the first shield member or the second member. The third member is constructed of a ferromagnetic material which is permanently magnetized.

In another embodiment, the second member has a first magnetic pole and the third member has a second magnetic pole which is oriented other than generally parallel with the first magnetic pole.

In still another embodiment, a method of depositing material on a semiconductor workpiece using a plasma reactor having a target and a semiconductor workpiece support facing the target along an axis disclosed. The workpiece is placed in a chamber, and a plasma is generated in the chamber. The material is sputtered with the plasma in a plasma region to produce sputtered material particles. A magnetic flux density is attenuated with a first shield member, at least a portion of which is disposed in a region located between first and second imaginary parallel planes located along the axis at axial locations between the target and the workpiece support. Magnetic field lines are provided from a second member into the plasma region. The second member is constructed of a ferromagnetic material which is permanently magnetized and is disposed so that at least a portion is in the region located between the first and second planes.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

DETAILED DESCRIPTION OF THE PREFERRED EMBODIMENTS

In the following description, reference is made to the accompanying drawings which form a part hereof and which illustrate several embodiments of the present invention. It is understood that other embodiments may be utilized and structural and operational changes may be made without departing from the scope of the present invention.

Embodiments of this invention include a magnetic shield assembly which substantially surrounds a plasma region of a plasma reactor. The shield assembly uses a passive shield member in combination with an active shield member. As a result, effective shielding of magnetic flux can occur while reducing distortion of the magnetic field line pattern in the plasma region of the plasma reactor. As used herein, the term "active" when used in connection with shields or members refers to that which is constructed of a ferromagnetic material which has been permanently magnetized prior to being placed into service. The term "passive" refers to a shield or member that is constructed of a material which will attenuate a magnetic flux density, but which is not permanently magnetized prior to being placed into service.

Figure 1:
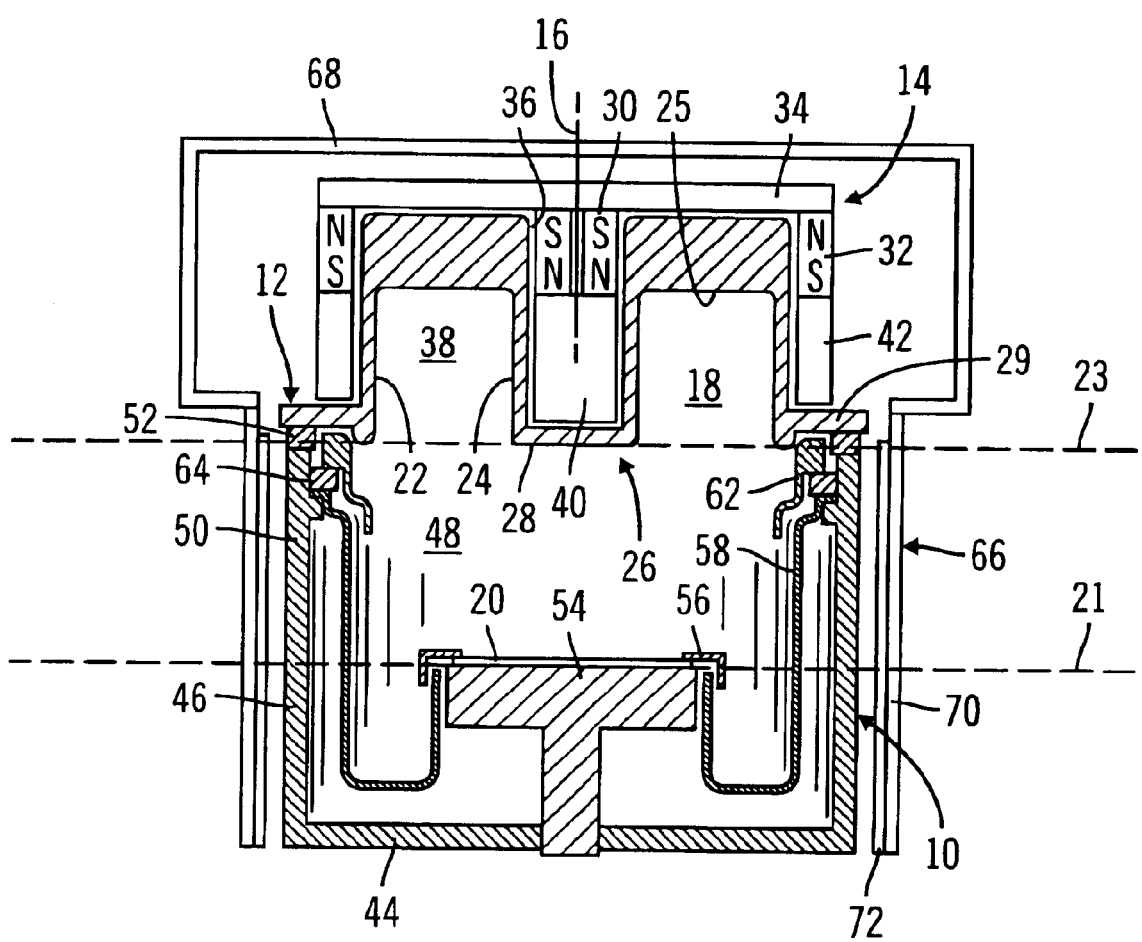
FIG. 1 is a cross-sectional view of a plasma reactor and magnetic shielding assembly in accordance with one embodiment of the present invention.

A first embodiment is illustrated by a magnetron plasma reactor 10 in the schematic cross-sectional view of FIG. 1. It includes a vault-shaped sputter target 12 and magnetron 14 symmetrically arranged about a central axis 16. The target 12 is composed of the material to be sputter deposited. The target 12 includes an annularly shaped downwardly facing vault 18 facing a wafer 20 which in turn is mounted on a semiconductor workpiece support, such as a pedestal electrode 54. The workpiece support or pedestal 54 has a generally planar support surface which is adapted to receive the wafer 20 and which defines a first imaginary plane 21 located along the axis 16. The vault 18 has an outer sidewall 22 outside of the periphery of the wafer 20, an inner sidewall 24 overlying the wafer 20, and a generally flat vault top wall or roof 25 (which closes the bottom of the downwardly facing vault 18). The vault 18 therefore defines an upper plasma region 38 for use in the sputtering process.

The target 12 includes a flange 29 that is vacuum sealed to the chamber body of the sputter reactor 10. The target 12 also includes a central portion forming a post 26 including the inner sidewall 24 and a generally planar surface 28 facing the pedestal 54 and the wafer 20 along the axis 16. Thus the target 12 has a plurality of generally planar surfaces which are generally parallel to the pedestal 54. Moreover, the target 12 has a portion (in this case the surface 28) which is disposed closest to the pedestal 54 and which defines a second imaginary plane 23 that is generally parallel to the first plane 21 and that is located along the axis 16.

The magnetron 14 includes one or more central magnets 30 having a first vertical magnetic polarization and one or more outer magnets 32 of a second vertical magnetic polarization opposite the first polarization and arranged in an annular pattern. In this embodiment the magnets 30, 32 are permanent magnets, that is, composed of ferromagnetic material which has been permanently magnetized.

The inner magnets 30 are disposed within a cylindrical central well 36 formed between the opposed portions of the inner target sidewall 24 while the outer magnets 32 are disposed generally radially outside of the outer target sidewall 22. A circular magnetic yoke 34 magnetically couples tops of the inner and outer magnets 30, 32. The yoke is composed of a magnetically soft material, such as 410 stainless steel, that can be magnetized to thereby form a magnetic circuit for the magnetism produced by the permanent magnets 30, 32.

A cylindrical inner pole piece 40 of a similarly magnetically soft material abuts the lower ends of the inner magnets 30 and extends deep within the target well 36 adjacent to the inner target sidewall 24. If the magnetron 14 is generally circularly symmetric, it is not necessary to rotate it for uniformity of sputter deposition. A tubular outer pole piece 42 of a magnetically soft material abuts the lower end of the outer magnets 32 and extends downwardly outside of the outer target sidewall 22. The magnetic pole pieces 40, 42 and the magnets 30, 32 are configured and sized to emit a magnetic field in the target vault 18 that is largely perpendicular to the magnetic field of the corresponding associated magnets 30, 32.

The target 12 is vacuum sealed to a grounded vacuum chamber body 50 through a dielectric target isolator 52. The wafer 20 is clamped to the pedestal electrode 54 by, for example, a clamp ring 56 although electrostatic chucking is possible. An electrically grounded shield 58 acts as an anode with respect to the cathode target 12, which is negatively biased by an unillustrated power supply. An electrically floating shield 62 is supported on the electrically grounded shield 58 or chamber 50 by a dielectric shield isolator 64.

The chamber body 50 is comprised of a bottom wall 44 and a generally cylindrical side wall 46 which surrounds a lower plasma region 48 of the reactor 10. A shield assembly 66 for reducing the magnetic flux density outside of the reactor 10 is provided which substantially encloses the reactor 10. The shield assembly 66 includes an upper shield member 68 which surrounds and encloses the magnetron 14. A cylindrically-shaped, lower shield member 70 supports the upper shield member 68 and surrounds the chamber body side wall 46 in a parallel spaced-apart relationship. Thus a portion of the lower shield member 70 is disposed in a region located between the first plane 21 and the second plane 23.

Both the upper and lower shield members 68, 70 are passive shields i.e., they are constructed of a material which is adapted to attenuate a magnetic flux density and is not permanently magnetized prior to being placed into service. Preferred embodiments include material such as 410 stainless steel, mu-metal or soft iron. A generally cylindrically-shaped inner shield member 72 is attached to the lower shield member 70 and surrounds the chamber body side wall 46. The inner shield member 72 is an active shield, i.e., it is constructed of a ferromagnetic material which is permanently magnetized prior to being placed into service. Preferred embodiments include material such as samarium cobalt (SmCo) or neodymium iron boron (NdFeB). A portion of the inner shield member 72 is disposed in the region located between the first plane 21 and the second plane 23.

While the embodiment of FIG. 1 includes portions of the lower shield member 70 and inner shield member 72 being disposed in the region defined by the area between the first and second planes 21, 23, it can be appreciated that alternative embodiments may include alternative regions. These alternative regions can be defined by first and second imaginary parallel planes located along the axis 16 at axial locations between the pedestal and the target. For example, the first plane 21 can be at the location shown in FIG. 1 and a second plane can be disposed at an axial location equidistant between the pedestal 54 and the target 12. Alternatively, a second plane can be defined by a portion of the electrically floating shield 62 which is disposed closest to the pedestal 54, or by a portion of the target isolator 52 which is disposed closest to the pedestal 54.

It is believed that the combination of active and passive shield members such as that shown in FIG. 1 can provide both an effective attenuation of magnetic flux density external to the plasma reactor while at the same time minimizing distortion of the magnetic field lines in the chamber lower plasma region 48. These effects are illustrated in FIGS. 10–12.

Figure 10:
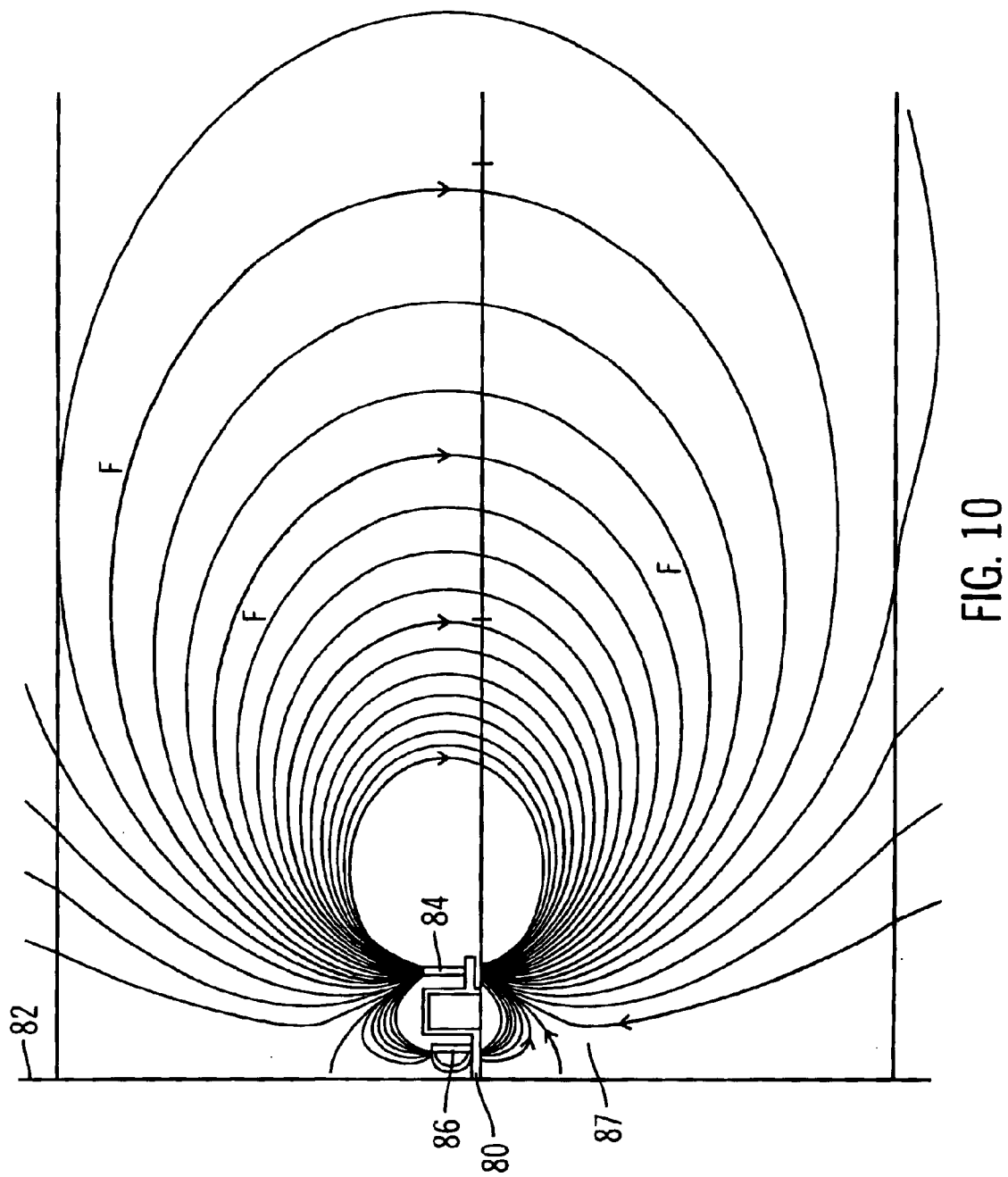
FIG. 10 is a schematic cross-sectional view of a magnetic field line profile for an unshielded plasma reactor.

Referring first to FIG. 10, a cross sectional, schematic view of a vaulted target 80 about a plasma reactor centerline 82 is shown. The target 80 is disposed above a lower plasma region 87 which is in proximity to an unillustrated wafer. An outer magnet 84, which is part of a magnetron, has a magnetic pole wherein the north end of the pole is oriented in an upward direction. An inner magnet 86, which also is part of the magnetron, is located on the opposite side of the vault portion of the target 80, closer to the centerline 82. The inner magnet 86 has a magnetic pole which is oriented in an opposite direction as the pole of the outer magnet 84. There is no passive or active magnetic shielding of the reactor of FIG. 10, and accordingly, the magnetic field lines F represent the unattenuated flux generated by the magnetron magnets 84, 86.

It is believed that increasingly strong magnetron magnets create an unshielded flux of sufficient strength that neighboring equipment, including other plasma reactors, are adversely affected. For example in plasma reactors of certain designs, a normal magnetic field strength at the wafer level has been observed to be about 4 gauss when there is no interfering flux caused by magnetrons in neighboring reactors. However, interfering magnetic flux has resulted in observed, undesirable variations ranging from a low of 2 gauss to a high of 10 gauss field strength. Moreover, this interference sometimes has caused a change in the magnetic field vectors such that the parabolic shape of the plasma itself in the plasma region has been shifted to one side or the other of the plasma chamber, thus causing wafer deposition non-uniformity.

Figure 11:
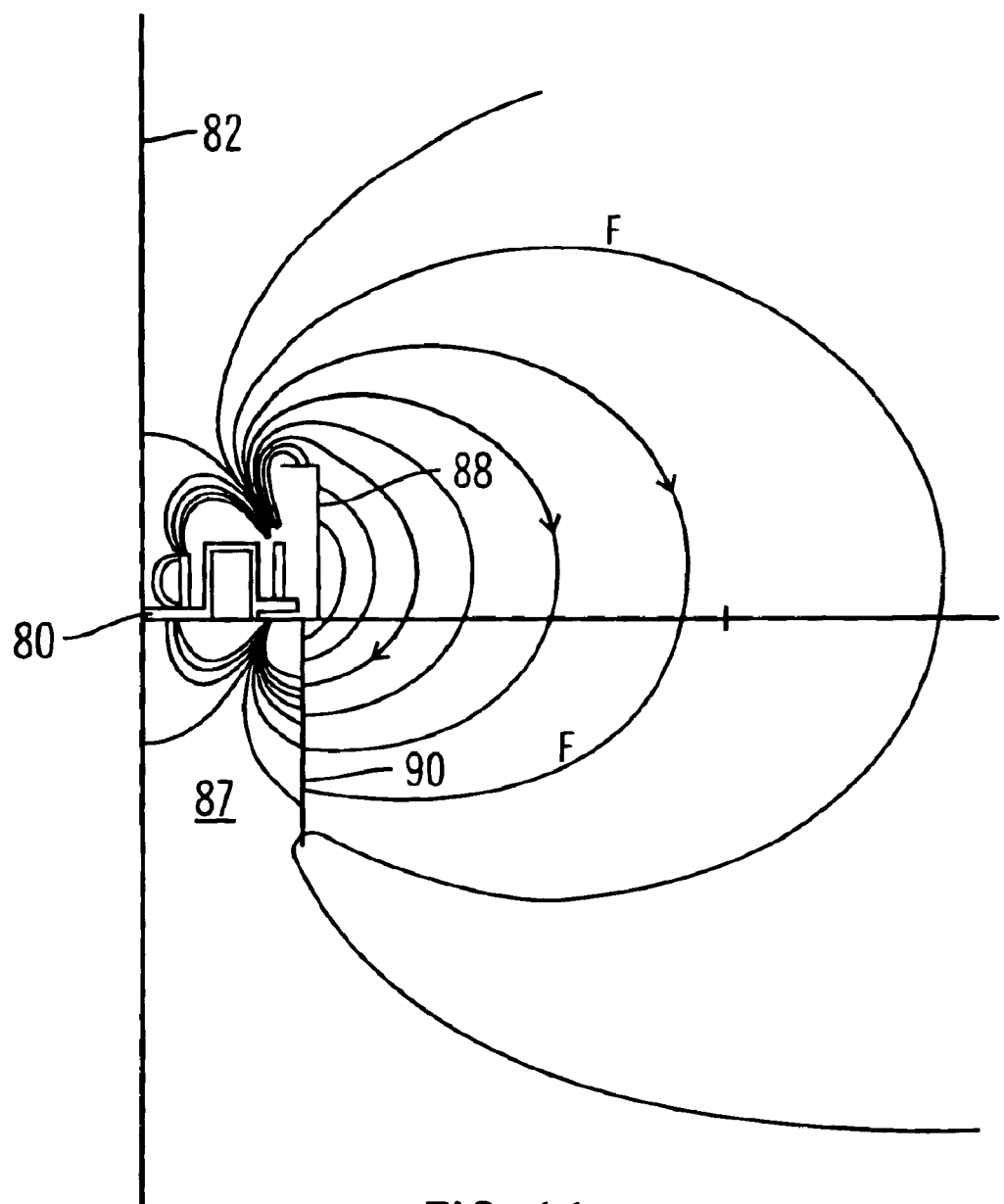
FIG. 11 is a schematic cross-sectional view of a magnetic field line profile for a plasma reactor having passive shields.
Figure 12:
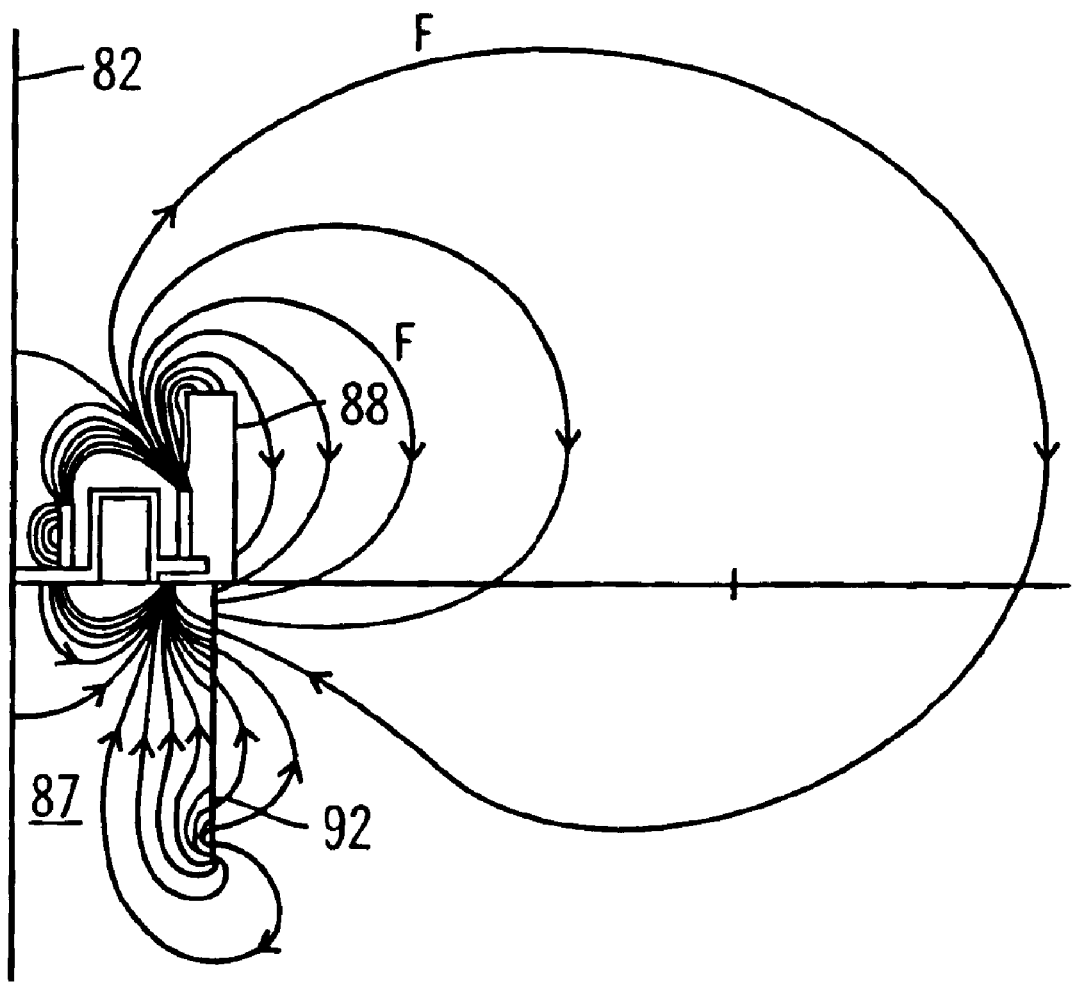
FIG. 12 is a schematic cross-sectional view of a magnetic field line profile for a plasma reactor having a passive and active shield.

FIG. 11 shows an attenuated flux which results from the placement of passive shielding around a plasma reactor. The arrangement of the target 80 and magnets is the same as that in FIG. 10. However, the placement of an upper shield member 88 adjacent to the magnetron magnets and a lower shield member 90 in a spaced apart relationship from the lower plasma region 87 results in a significant attenuation of the flux in the regions outside of the plasma reactor. The upper and lower shield members 88, 90 of FIG. 11 are passive shields, and although they provide sufficient flux density attenuation external to the reactor to satisfactorily reduce interference to adjacent equipment, the presence of these shields affects the magnetic fields such that there is an undesirable distortion of the field line pattern in the lower plasma region 87 of the reactor, as is evident by a comparison of this region in FIGS. 10 and 11. This distortion can reduce the number of electrons trapped in the lower plasma region 87 which in turn can reduce the plasma density and sputter rate in the reactor.

It is believed that a combined active and passive shield arrangement can be constructed to reduce this magnetic field line distortion. FIG. 12 shows the same arrangement as that of FIG. 11 with the exception of the lower shield member. In FIG. 12, a passive lower shield member is connected to an active inner shield member to form a combined lower shield 92. (The combined lower shield 92 is a composite structure having the same arrangement as the lower shield member 70 and the inner shield member 72 shown in FIG. 1.) By constructing an active shield member having a certain magnetic field strength and magnetic pole orientation which is adapted for a particular plasma reactor and magnetron design, the magnetic field in the lower plasma region 87 can be made to more closely approximate that of an unshielded reactor as is evident by a comparison of the fields in this region in FIGS. 10 and 12, thus providing an improved plasma density.

By using magnetic field simulation computer software or actual instrumentation, the field lines for a reactor having no passive or active shielding can be mapped at the location where the shielding otherwise would be disposed, i.e., at the location of the boundary of the inner face of the lower passive shield. Then a lower passive shield can be placed at the desired location relative to the plasma reactor (either via computer simulation or using an actual shield). Either through trial and error or using calculations or both, a magnetic structure can be created having a specific size, location, magnetic strength and magnetic pole orientation.

This magnetic structure can act in combination with the passive shield to recreate, as closely as possible, the magnetic field lines at this boundary location as they would exist for an unshielded reactor. It is believed that the passive shield is magnetically coupled to the magnetic structure so that it acts to redirect the magnetic field lines traveling through the passive shield in such a way that they exit the passive and active shield assembly at the desired locations. It is further believed that if the field lines can be re-created at the boundary, then their pattern in the plasma region will approximate the pattern of a completely unshielded reactor.

Figure 2:
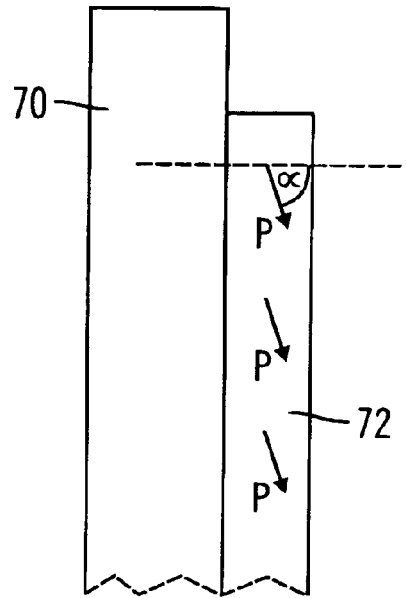
FIG. 2 is an enlarged cross-sectional view of two shield members of FIG. 1.

Referring to FIG. 2, an enlarged cross-section view of a portion of the lower shield member 70 and the inner shield member 72 of FIG. 1 is shown. The inner member 72 is an active shield with a magnetic pole P which is oriented in a direction other than generally parallel with and generally perpendicular to the central axis 16 of FIG. 1. The optimum pole orientation angle varies with the design of the plasma reactor, the magnetron and the shielding materials used.

For example, if plasma reactor model SIP+J Copper PVD, manufactured by Applied Materials, Inc. of Santa Clara, Calif. is used with a cylindrically-shaped passive shield member constructed of 410 Stainless Steel and 0.1 inches thick, and assuming a cylindrically-shaped, active inner shield member constructed of NdFeB, is 0.1 inches thick, and is magnetized to a strength of 48 mega gauss oersteds (MGO), then it is believed that an optimum magnetic field line profile in the lower plasma region 48 (FIG. 1) can be created when one end of the magnetic pole P is oriented in a direction generally away from the lower shield member 70 and generally away from the target 12 (FIG. 1) and at an angle between 67° and 87°, and preferably 77.5°, from a line running orthogonal to the centerline of the reactor, as shown by the angle α in FIG. 2.

Figure 3:
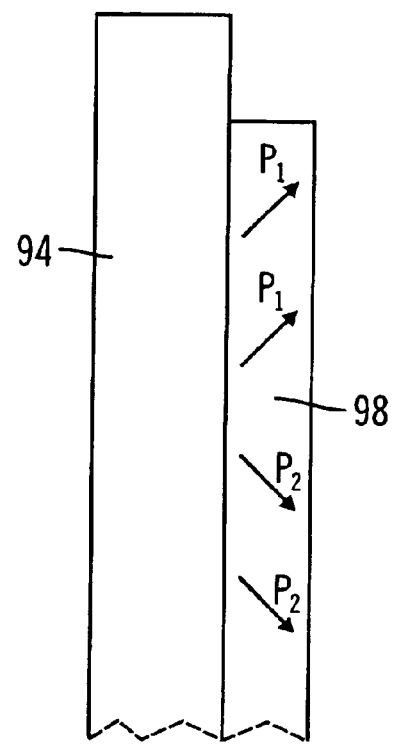
FIG. 3 is an enlarged cross-sectional view of two shield members in accordance with another embodiment of the present invention.

In an alternative embodiment shown in FIG. 3, an active member 98 of a different construction is attached to a passive member 94. The active member has two magnetized regions wherein there is a first magnetic pole $P_1$ as well as a second magnetic pole $P_2$ which is oriented other than generally parallel with the first magnetic pole $P_1$. In the design of FIG. 3, both the first and second magnetic poles are oriented other than generally parallel with and generally perpendicular to the centerline of the reactor.

Figure 4:
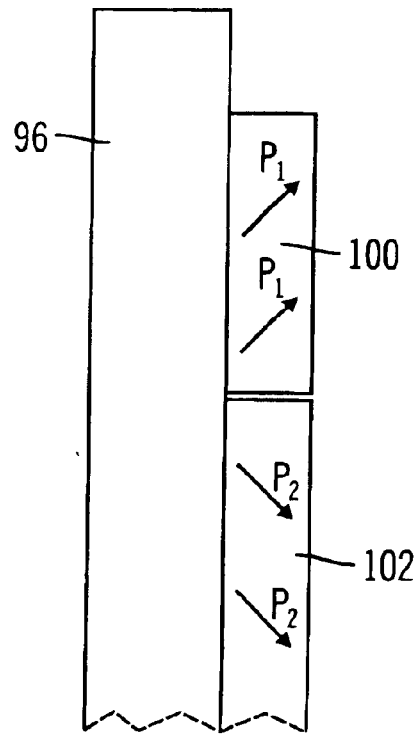
FIG. 4 is an enlarged cross-sectional view of two shield members in accordance with another embodiment of the present invention.

The arrangement of FIG. 4 may achieve a closely similar result as that of FIG. 3. In FIG. 4 there are a first and a second active member 100, 102 in close proximity to one another, each of which is attached to a passive member 96. The first active member 100 has a first magnetic pole $P_1$, whereas the second active member 102 has a second magnetic pole $P_2$ which is oriented other than generally parallel with the first magnetic pole $P_1$.

Although the embodiment of FIG. 4 shows the active members 100, 102 on the same side of the passive member 96, an alternative embodiment involves placing one of the active members 100, 102 on one side of the passive member 96 and placing the other of the active members 100, 102 on the opposite side of the passive member 96. In such event however, it may be necessary to adjust the magnetic strength or magnetic pole orientation of one or both of the active members 100, 102 to achieve a desired magnetic field pattern in the plasma region of the reactor.

Figure 5:
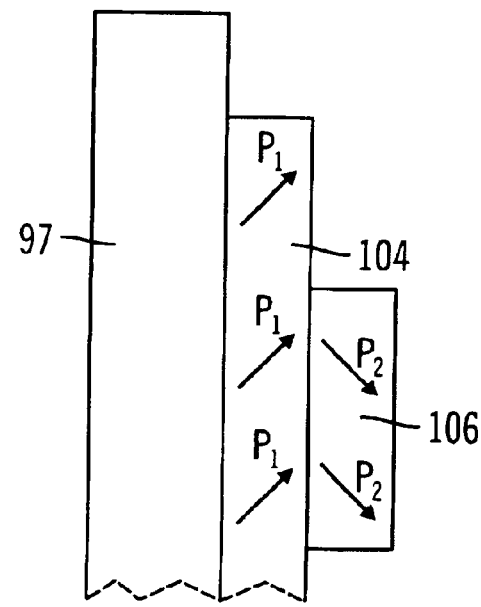
FIG. 5 is an enlarged cross-sectional view of two shield members in accordance with another embodiment of the present invention.

FIG. 5 shows one active member attached to another. A first active member 104 with a first magnetic pole $P_1$ is attached to a passive member 97. A second active member 106 with a second magnetic pole $P_2$ is attached to the first active member 104. The second magnetic pole $P_2$ is oriented in a direction that is other than generally parallel with the direction of the first magnetic pole $P_1$. Thus the vectors represented by the first and second magnetic poles $P_1$, $P_2$ can create a resultant magnetic pole vector and magnetic strength to achieve the desired field profile in the plasma region.

The active members shown in FIGS. 1–5 can be in a variety of shapes. They can be constructed of a sheet of magnetized material having a generally planar, arcuate, spherical or cylindrical shape. Alternatively, they can be bars or cylinders. These active members can be sized to substantially surround a reactor plasma region, or they can be smaller and be strategically placed in selected locations on or near a passive shield member in order to achieve the desired magnetic field profile in the reactor plasma region.

Figure 6:
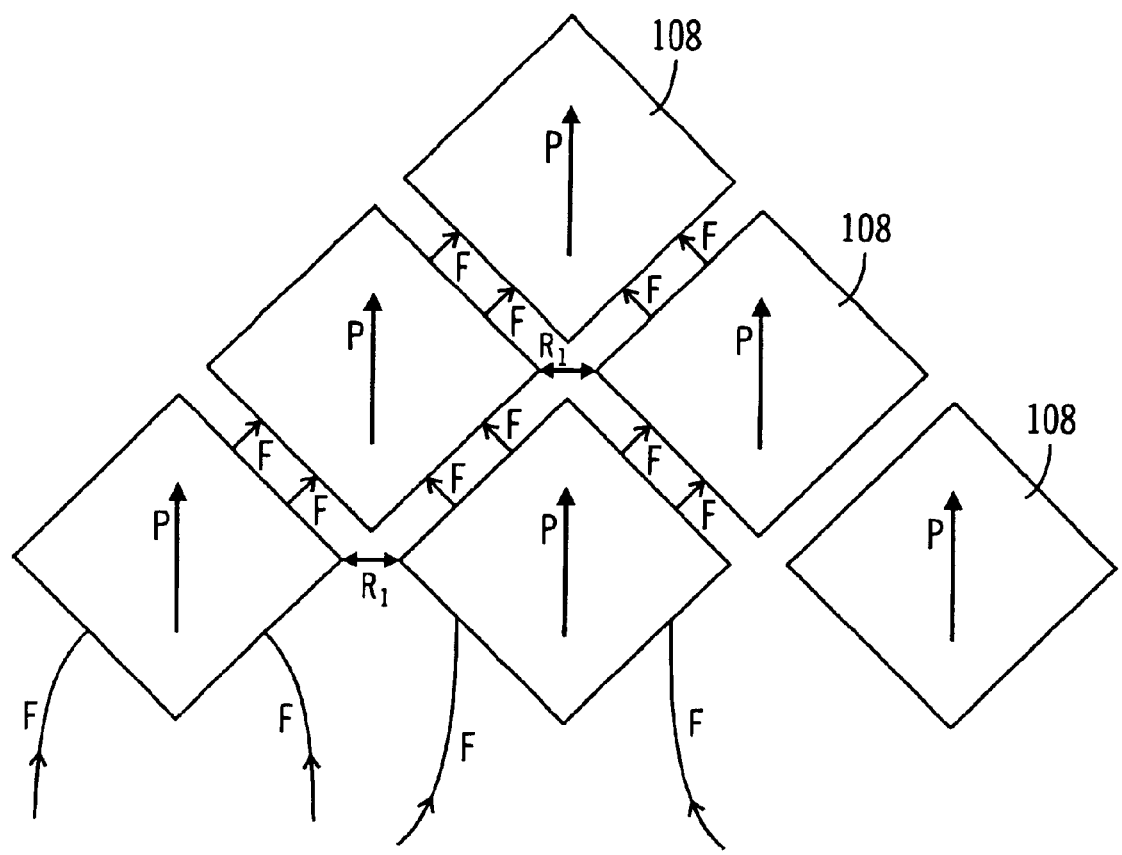
FIGS. 6 and 7 are plan views of active shield members in accordance with another embodiment of the present invention.
Figure 7:
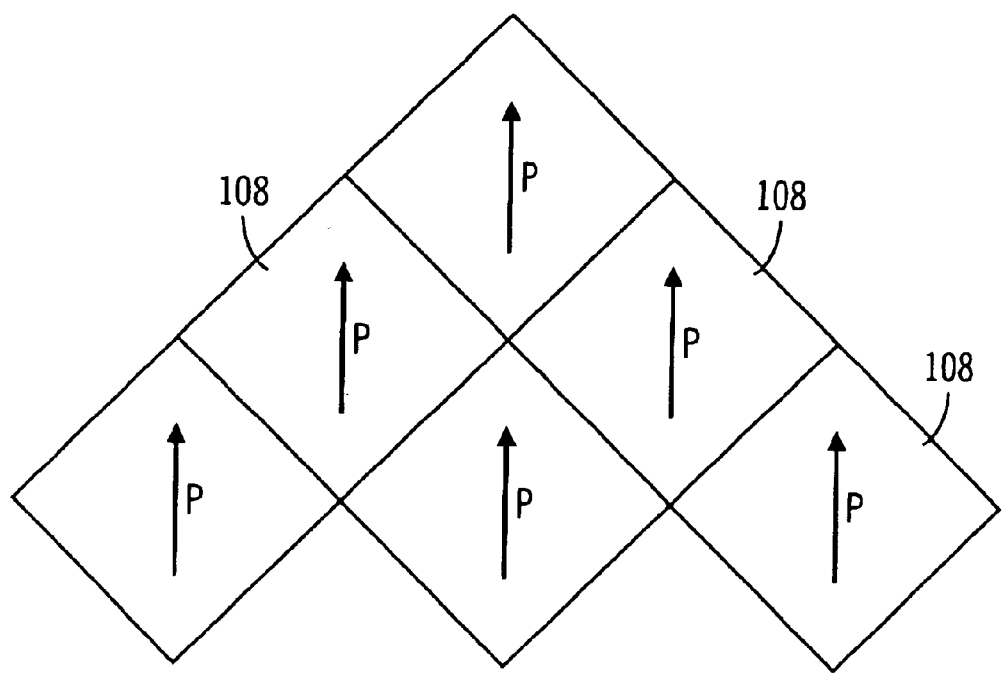
Figure 8:
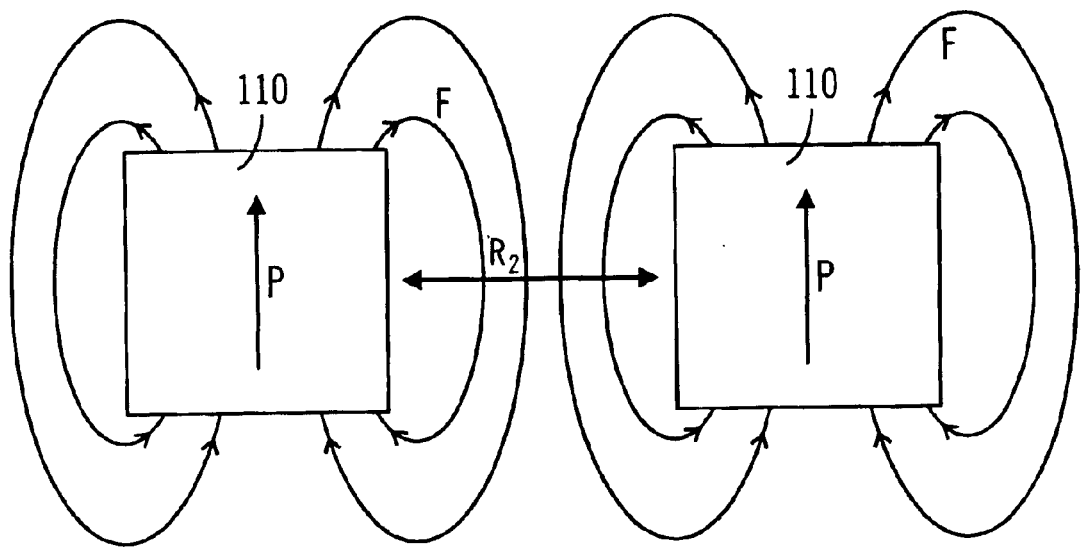
FIG. 8 is a plan view of magnetic tiles having a different magnetic pole orientation than that of FIGS. 6 and 7.

FIG. 6 depicts a plurality of active members which are in the form of magnetized tiles having a generally square shape. One face of each tile 108 is attached to an unillustrated passive shield member. Each tile 108 has a magnetic pole P which is oriented generally diagonally to its sides. This orientation permits the tiles to abut one another in an array as shown in FIG. 7 without being subject to an excessive repulsive magnetic force. If the magnetic pole orientation of tiles was generally perpendicular to two of its sides, as shown for the tiles 110 in FIG. 8, then a larger repulsive magnetic force $R_2$ would be created between the tiles 110. This in turn may hinder the placement of the tiles 110 in proximity to one another on a passive shield member. The repulsive magnetic force $R_1$ of FIG. 6, on the other hand, is smaller between the tiles 108 and can be overcome by the attractive force of the magnetic field lines F between the tiles.

Figure 9:
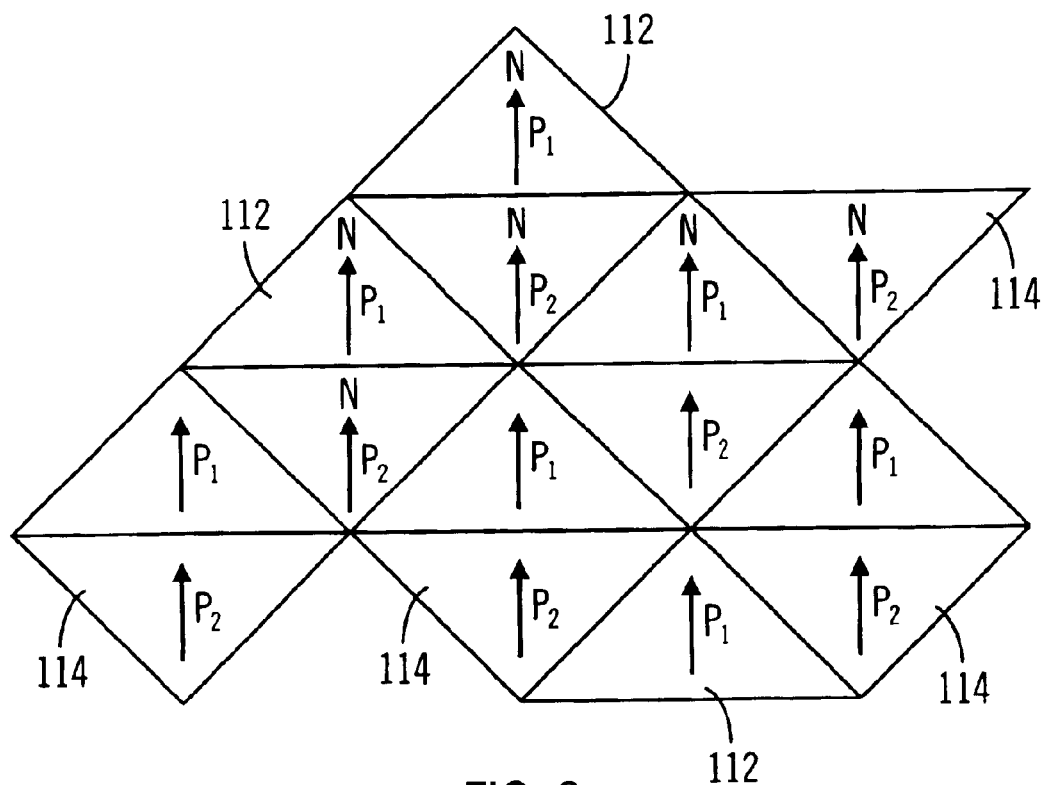
FIG. 9 is a plan view of active shield members in accordance with another embodiment of the present invention.

An alternative embodiment includes a plurality of active members which are in the form of tiles having a generally triangular shape. As shown in FIG. 9, each of the tiles has three sides and a magnetic pole which is oriented generally perpendicular to one of said three sides. In order to enhance the magnetic attraction among the tiles and to facilitate their placement in an array, each tile 112 of a first group of tiles is alternatively placed adjacent to a tile 114 of a second group. The tiles 112 of the first group each have a magnetic pole $P_1$ which is oriented so that the North pole is pointed to a vertex of the triangle. On the other hand, the tiles 114 of the second group each have a pole $P_2$ which is oriented so that the South pole points to a vertex of the triangle.

The advantage of magnetized tiles, such as those shown in FIGS. 7 and 9, is that they can be placed on selected regions of a passive shield which permits a localized and changeable creation and adjustment of magnetic field profiles in the plasma region of the reactor. While the active members of FIGS. 7 and 9 are in the shape of squares and triangles, it can be appreciated by those skilled in the art that any other shape, regular or irregular, may be employed without departing from the spirit of the invention.

In the embodiments disclosed in FIGS. 1–9, the active shielding members are attached to a passive shield member or to another active member. These may be attached by use of an adhesive. Alternative means for attaching these members may include screws, fasteners, brackets, clamps, dowels, hooks, latches, lugs, locks, pins, bolts, nails, rivets, or any other known fastening means, or even attachment via an attractive magnetic force generated by the active members.

In other embodiments, the active members may not be attached to the passive shield member at all, but rather, may removably abut the passive shield member. Alternatively, the active members may be spaced apart from the passive shield member, so long as the active and passive members are in sufficient proximity to be magnetically coupled in such a way that the active member redirects the magnetic field lines passing through the passive member in order to achieve the desired field line profile in the plasma region of interest. In still further embodiments, the active members may be positioned on the exterior side of the passive shield member, i.e., opposite of that shown in FIGS. 1 and 2. Additionally, the passive members or active members (or both of them) may be disposed inside the reactor chamber body 50 (FIG. 1), so long as the interior operating temperatures of the reactor are below the curie temperature of the magnetized material from which the active members are constructed.

The embodiment of FIG. 1 discloses a shield assembly used with a plasma chamber having a vault-shaped target and a magnetron symmetrically arranged about a central axis. It will be appreciated by those in the art, however, that the invention disclosed herein may be used with plasma chambers of other designs. For example plasma chambers having magnetrons of different designs as well as targets of other geometries, such as generally flat, domed, cylindrical or box-shaped targets may be employed with the disclosed shield assemblies without departing from the spirit of the invention described herein.

Figure 13:
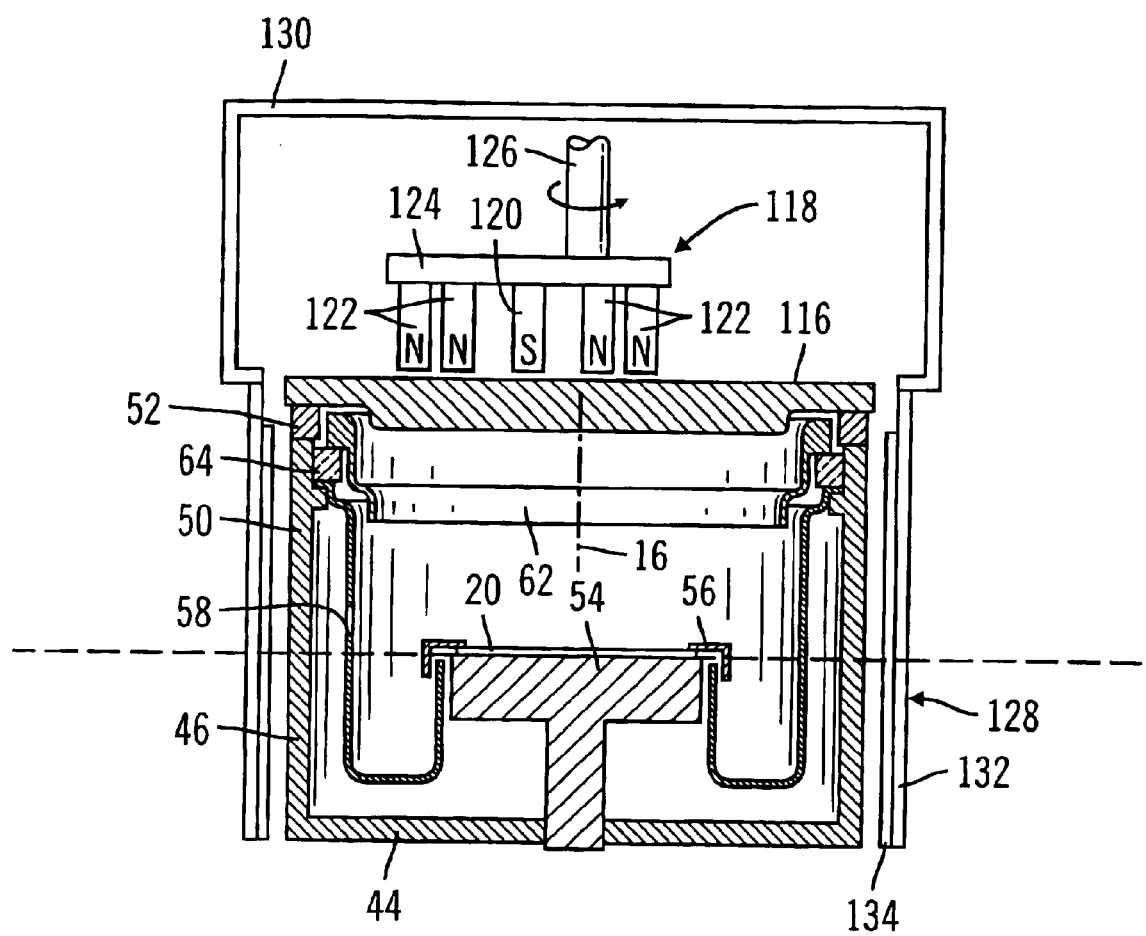
FIG. 13 is a cross-sectional view of a plasma reactor of a different design and magnetic shielding assembly in accordance with another embodiment of the present invention.

FIG. 13 shows a plasma reactor having a generally flat target 116. The components located below the target 116 within the reactor operate in the same general manner as those in the reactor of FIG. 1 and need not be described again. However the target 116, which is seated on the target isolator 52, is generally planar in shape. An asymmetrically-arranged magnetron 118 is positioned in back of the target 116, and has an inner magnet 120 and opposing outer magnets 122 connected and supported by a magnetic yoke 124. The magnetron 118 is rotated about the central axis 16 of the reactor by a motor-driven shaft 126 to achieve full coverage in sputtering the target 116. The shield assembly 128, including the upper shield member 130, the lower shield member 132 and the inner shield member 134, have a generally similar geometry as that shown in FIG. 1.

Furthermore, although the embodiments of FIGS. 1 and 13 disclose plasma chambers for use in PVD operations, it should be appreciated that the invention disclosed herein is applicable as well to other plasma chambers, such as CVD and etch chambers.

While the description above refers to particular embodiments of the present invention, it will be understood that many modifications may be made without departing from the spirit thereof. The claims are intended to cover such modifications as would fall within the true scope and spirit of the present invention. The presently disclosed embodiments are therefore to be considered in all respects as illustrative and not restrictive, the scope of the invention being indicated by the claims rather than the foregoing description, and all changes which come within the meaning and range of equivalency of the claims are therefore intended to be embraced therein.

What is claimed is:

1. A shield assembly for a plasma reactor having a target and a semiconductor workpiece support facing said target along an axis, the shield assembly comprising:

a first shield member constructed of a material which is adapted to attenuate a magnetic flux density, said first shield member being disposed so that at least a portion is in a region located between first and second imaginary parallel planes located along said axis at axial locations between said target and said workpiece support; and a second member magnetically coupled with the first shield member, said second member being constructed of a ferromagnetic material which is permanently magnetized, said second member being disposed so that at least a portion is in the region located between the first and the second planes.

2. The shield assembly of claim 1 wherein the workpiece support has a generally planar support surface which defines the first plane and wherein the second plane is disposed at an axial location equidistant between the workpiece support and the target.

3. The shield assembly of claim 1 wherein the workpiece support has a generally planar support surface which defines the first plane and wherein the plasma reactor has an electrically floating shield having a shield portion which is disposed closest to the workpiece support and wherein the second plane is defined by the shield portion.

4. The shield assembly of claim 1 wherein the workpiece support has a generally planar support surface which defines the first plane and wherein the target has a target portion which is disposed closest to the workpiece support and wherein the second plane is defined by said closest target portion.

5. The shield assembly of claim 1 wherein the workpiece support has a generally planar support surface which defines the first plane and wherein the plasma reactor has a target isolator having an isolator portion which is disposed closest to the workpiece support and wherein the second plane is defined by the isolator portion.

6. The shield assembly of claim 1 wherein the second member is a sheet of material having one of a generally planar and a generally arcuate shape.

7. The shield assembly of claim 1 wherein the plasma reactor has a plasma region and wherein the first shield member and the second member are adapted to substantially surround the plasma region.

8. The shield assembly of claim 7 wherein the first shield member and the second member are substantially cylindrical in shape.

9. The shield assembly of claim 1 wherein the second member is disposed in a parallel, spaced-apart relationship with the first shield member.

10. The shield assembly of claim 9 wherein the second member is a sheet of material having one of a generally planar and a generally arcuate shape.

11. The shield assembly of claim 9 wherein the plasma reactor has a plasma region and wherein first shield member and the second member are adapted to substantially surround the plasma region.

12. The shield assembly of claim 11 wherein the first shield member and the second member are substantially cylindrical in shape.

13. The shield assembly of claim 1 wherein the plasma reactor has a chamber adapted to contain a plasma and wherein the first shield member and the second member are disposed outside of the chamber.

14. The shield assembly of claim 1 wherein the workpiece support has a generally planar portion disposed closest to the target, said planar portion defining the first plane.

15. The shield assembly of claim 1 wherein the workpiece support has a generally planar support surface and wherein the axis is orthogonal to the support surface, wherein the second member is disposed between the first shield member and the axis, wherein the second member has a magnetic pole having one end which is oriented generally away from the first shield member and generally away from the target and at an angle between 67° and 87° from a line running orthogonal to the axis.

16. A shield assembly for a plasma reactor having a target and a semiconductor workpiece support facing said target along an axis, the shield assembly comprising:
- a first shield member constructed of a material which is adapted to attenuate a magnetic flux density, said first shield member being disposed so that at least a portion is in a region located between first and second imaginary parallel planes located along said axis at axial locations between said target and said workpiece support; and
- a second member abutting the first shield member, said second member being constructed of a ferromagnetic material which is permanently magnetized, said second member being disposed so that at least a portion is in the region located between the first and the second planes.

17. The shield assembly of claim 16 wherein the second member removably abuts the first shield member.

18. The shield assembly of claim 16 wherein the second member is attached to the first shield member.

19. The shield assembly of claim 18 wherein the second member is a sheet of material having one of a generally planar and a generally arcuate shape.

20. The shield assembly of claim 19 wherein the second member is a first tile, the shield assembly further comprising:
- a plurality of additional tiles attached to the first shield member, said additional tiles being constructed of a ferromagnetic material which is permanently magnetized.

21. The shield assembly of claim 20 wherein each of said first tile and said additional tiles has four sides and a magnetic pole which is oriented generally diagonally to the sides.

22. The shield assembly of claim 20 wherein each of said first tile and said additional tiles has three sides and a magnetic pole which is oriented generally perpendicular to one of said three sides.

23. The shield assembly of claim 20 wherein said first tile and said additional tiles are disposed in an array.

24. The shield assembly of claim 19 wherein the second member has a first magnetic pole and a second magnetic pole which is oriented other than generally parallel with the first magnetic pole.

25. The shield assembly of claim 18 further comprising:
- a third member attached to one of the first shield member and the second member, said third member being constructed of a ferromagnetic material which is permanently magnetized.

26. The shield assembly of claim 25 wherein the second member has a first magnetic pole and the third member has a second magnetic pole which is oriented other than generally parallel with the first magnetic pole.

27. The shield assembly of claim 18 Wherein the plasma reactor has a plasma region and wherein the first shield member is adapted to substantially surround the plasma region.

28. The shield assembly of claim 27 wherein the second member is adapted to substantially surround the plasma region.

29. The shield assembly of claim 28 wherein the first shield member and the second member are substantially cylindrical in shape.

30. The shield assembly of claim 18 wherein the second member is constructed of one of samarium cobalt and neodymium iron boron.

31. The shield assembly of claim 30 wherein the first shield member is constructed of one of 410 stainless steel, mu-metal and soft iron.

32. The shield assembly of claim 18 wherein the workpiece support has a generally planar support surface which defines the first plane and wherein the second plane is disposed at an axial location equidistant between the workpiece support and the target.

33. The shield assembly of claim 18 wherein the workpiece support has a generally planar support surface which defines the first plane and wherein the plasma reactor has an electrically floating shield having a shield portion which is disposed closest to the workpiece support and wherein the second plane is defined by the shield portion.

34. The shield assembly of claim 18 wherein the workpiece support has a generally planar support surface which defines the first plane and wherein the target has a target portion which is disposed closest to the workpiece support and wherein the second plane is defined by said target portion.

35. The shield assembly of claim 18 wherein the workpiece support has a generally planar support surface which defines the first plane and wherein the plasma reactor has a target isolator having an isolator portion which is disposed closest to the workpiece support and wherein the second plane is defined by the isolator portion.

36. A shield assembly for a plasma reactor having a semiconductor workpiece support and a target, said semiconductor workpiece support having a generally planar semiconductor workpiece support surface which is adapted to receive a semiconductor wafer and which defines a first imaginary plane, said target having a plurality of generally planar target surfaces which are generally parallel with the first plane, at least one of said target surfaces being disposed closest to the semiconductor workpiece support and defining a second imaginary plane, the shield assembly comprising:
- a first shield member constructed of a material which is adapted to attenuate a magnetic flux density, said first shield member being disposed so that at least a portion is in a region located between the first and the second planes; and
- a second member magnetically coupled with the first shield member, said second member being constructed of a ferromagnetic material which is permanently magnetized, said second member being disposed so that at least a portion is in the region located between the first and the second planes.

37. The shield assembly of claim 36 wherein the second member abuts the first shield member.

38. A shield assembly for a plasma reactor having a generally cylindrical side wall, the shield assembly comprising:
- a first shield member constructed of a material which is adapted to attenuate a magnetic flux density, said first shield member substantially surrounding the side wall; and
- a second member attached to the first shield member, said second member being constructed of a ferromagnetic material which is permanently magnetized.

39. The shield assembly of claim 38 wherein the second member substantially surrounds the side wall.

40. The shield assembly of claim 39 wherein the first shield member and the second member are substantially cylindrical in shape.

41. The shield assembly of claim 38 wherein the side wall defines a cylinder having an axis and wherein the second member has a first magnetic pole which is oriented other than generally parallel with and generally perpendicular to the axis.

42. The shield assembly of claim 41 further comprising:
a third member attached to one of the first shield member and the second member, said third member being constructed of a ferromagnetic material which is permanently magnetized and having a second magnetic pole which is oriented other than generally parallel with the first magnetic pole.

43. The shield assembly of claim 38 wherein the plasma reactor has a target, wherein the side wall defines a cylinder having an axis, wherein the second member is disposed between the first shield member and the side wall, and wherein the second member has a first magnetic pole with one end which is oriented in a direction generally away from the first shield member and generally away from the target.

44. The shield assembly of claim 43 wherein the one end of the first magnetic pole is oriented at an angle between 67° and 87° from a line running orthogonal to the axis.

45. A magnetic shield for a plasma reactor having a generally cylindrical side wall and having a generally cylindrical first shield member substantially surrounding the side wall, said first shield member constructed of a material which is adapted to attenuate a magnetic flux density, the magnetic shield comprising:
a generally cylindrical second shield member adapted for attachment to the first shield member and for substantially surrounding the side wall, said second shield member being constructed of a ferromagnetic material which is permanently magnetized.

46. An apparatus for processing a semiconductor wafer, comprising:
a target;
a bottom wall;
a side wall connected to the bottom wall, said bottom and side walls forming a cavity;
a semiconductor workpiece support disposed in the cavity, said semiconductor workpiece support facing said target along an axis;
a first shield member constructed of a material which is adapted to attenuate a magnetic flux density, said first shield member being disposed so that at least a portion is in a region located between first and second imaginary parallel planes located along said axis at axial locations between said target and said workpiece support; and
a second member abutting the first shield member, said second member being constructed of a ferromagnetic material which is permanently magnetized, said second member being disposed so that at least a portion is in the region located between the first and the second planes.

47. The apparatus of claim 46 wherein the second member removably abuts the first shield member.

48. The apparatus of claim 46 wherein the second member is attached to the first shield member.

49. The apparatus of claim 48 wherein the side wall defines a cylinder having an axis and wherein the second member has a first magnetic pole which is oriented other than generally parallel with and generally perpendicular to the axis.

50. The apparatus of claim 49 further comprising:
a third member attached to one of the first shield member and the second member, said third member being constructed of a ferromagnetic material which is permanently magnetized and which has a second magnetic pole which is oriented other than generally parallel with the first magnetic pole.

51. The apparatus of claim 48 comprising:
a third member attached to one of the first shield member and the second member, said third member being constructed of a ferromagnetic material which is permanently magnetized.

52. The apparatus of claim 51 wherein the second member has a first magnetic pole and the third member has a second magnetic pole which is oriented other than generally parallel with the first magnetic pole.

53. The apparatus of claim 48 wherein the workpiece support has a generally planar support surface which defines the first plane and wherein the second plane is disposed at an axial location equidistant between the workpiece support and the target.

54. The apparatus of claim 48 wherein the workpiece support has a generally planar support surface which defines the first plane and wherein the target has a target portion which is disposed closest to the workpiece support and wherein the second plane is defined by said target portion.

55. A method of depositing material on a semiconductor workpiece using a plasma reactor having a target and a semiconductor workpiece support facing said target along an axis, the method comprising:
placing the semiconductor workpiece in a plasma reactor chamber;
generating a plasma in the chamber;
sputtering the material with the plasma in a plasma region to produce sputtered material particles;
attenuating a magnetic flux density with a first shield member, at least a portion of which is disposed in a region located between first and second imaginary parallel planes located along said axis at axial locations between said target and said workpiece support; and
providing magnetic field lines from a second member into the plasma region, said second member being constructed of a ferromagnetic material which is permanently magnetized, said second member being disposed so that at least a portion is in the region located between the first and second planes.

56. The method of claim 55 wherein the chamber defines a cylinder and wherein the second member has a first magnetic pole which is oriented other than generally parallel with and generally perpendicular to the axis.

57. The method of claim 56 wherein the step of providing the magnetic field lines further comprises using a third member attached to one of the first shield member and the second member, said third member being constructed of a ferromagnetic material which is permanently magnetized and having a second magnetic pole which is oriented other than generally parallel with the first magnetic pole.

58. The method of claim 55 wherein the step of providing the magnetic field lines further comprises using a third member attached to one of the first shield member and the second member, said third member being constructed of a ferromagnetic material which is permanently magnetized.

59. The method of claim 58 wherein the second member has a first magnetic pole and the third member has a second magnetic pole which is oriented other than generally parallel with the first magnetic pole.

60. The method of claim 55 wherein the workpiece support has a generally planar support surface which defines the first plane and wherein the second plane is disposed at an axial location equidistant between the workpiece support and the target.

61. The method of claim 55 wherein the workpiece support has a generally planar support surface which defines the first plane and wherein the target has a target portion which is disposed closest to the workpiece support and wherein the second plane is defined by said target portion.

62. A shield assembly for a plasma reactor having a target and semiconductor workpiece support facing said target along an axis, said plasma reactor further having a side wall which at least partially surrounds a plasma region, the shield assembly comprising:

shielding means for attenuating a magnetic flux density, said shielding means being disposed so that at least a portion is in a region located between first and second imaginary parallel planes located along said axis at axial locations between said target and said workpiece support; and means for providing magnetic field lines into the plasma region, said providing means comprising a ferromagnetic material which is permanently magnetized, said providing means being disposed so that at least a portion is in the region located between the first and second planes.

63. A magnetic shield for a plasma reactor having a target and semiconductor workpiece support facing said target along an axis, said plasma reactor further having a side wall which at least partially surrounds a plasma region and further having a shielding means for attenuating a magnetic flux density, said shielding means being disposed so that at least a portion is in a region located between first and second imaginary parallel planes located along said axis at axial locations between said target and said workpiece support, the magnetic shield comprising:

means for providing magnetic field lines into the plasma region, said providing means comprising a ferromagnetic material which is permanently magnetized, said providing means being disposed so that at least a portion is in the region located between the first and second planes.

64. An apparatus for using a plasma to process a semiconductor workpiece, comprising:

a process chamber having a side wall which defines a cavity having a plasma region;

a target;

means for holding the workpiece in the cavity, said holding means facing said target along an axis;

means for trapping electrons in the plasma region;

shielding means for attenuating a magnetic flux density, said shielding means being disposed so that at least a portion is in a region located between first and second imaginary parallel planes located along said axis at axial locations between said target and said holding means; and means for providing magnetic field lines into the plasma region, said providing means being disposed so that at least a portion is in the region located between the first and second planes, said providing means comprising a ferromagnetic material which is permanently magnetized.

* * * * *